United States Patent
Gao et al.

(10) Patent No.: US 6,943,957 B2
(45) Date of Patent: Sep. 13, 2005

(54) LASER LIGHT SOURCE AND AN OPTICAL SYSTEM FOR SHAPING LIGHT FROM A LASER-BAR-STACK

(75) Inventors: Xin Gao, Hamamatsu (JP); Kazunori Shinoda, Hamamatsu (JP); Masayuki Saitoh, Hamamatsu (JP); Hiroshi Okamoto, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/816,181

(22) Filed: Apr. 2, 2004

(65) Prior Publication Data

US 2004/0257661 A1 Dec. 23, 2004

Related U.S. Application Data

(63) Continuation-in-part of application No. 10/360,642, filed on Feb. 10, 2003, now abandoned.

(30) Foreign Application Priority Data

Aug. 10, 2001 (JP) .................................... P2001-244701

(51) Int. Cl.[7] ............................ G02B 27/14; H01S 3/08
(52) U.S. Cl. .................... 359/634; 359/629; 359/638; 372/101
(58) Field of Search ................................ 359/618, 634, 359/583, 589, 722, 628, 640, 641, 629, 619–626; 372/9, 29.016, 29.02, 99, 101, 107; 250/578.1

(56) References Cited

U.S. PATENT DOCUMENTS

| | | | |
|---|---|---|---|
| 5,825,551 A | 10/1998 | Clarkson et al. | 359/629 |
| 6,493,148 B1 | 12/2002 | Anikitchev | 359/634 |

FOREIGN PATENT DOCUMENTS

| | | |
|---|---|---|
| JP | 07-098402 | 4/1995 |
| JP | WO 97/14073 | 4/1997 |
| JP | 9506715 | 6/1997 |
| JP | 09-307161 | 11/1997 |
| JP | 10-502746 | 3/1998 |
| JP | 10-50817 | 8/1998 |
| JP | 10-284779 | 10/1998 |
| JP | 10-510933 | 10/1998 |
| JP | 11-504131 | 4/1999 |

*Primary Examiner*—Georgia Epps
*Assistant Examiner*—Jack Dinh
(74) *Attorney, Agent, or Firm*—Morgan Lewis & Bockius LLP

(57) ABSTRACT

Refracting optical system 1 and 2 relatively shift the second laser beam groups together with respect to the first laser beam groups along the layering direction. The transmission/reflecting optical system for alignment 1R, 2R, 1S and 2S are used, so that the laser beam patterns comprised of the first and second laser beam groups which are emitted from the transmission/reflecting optical systems 1R, 2R, 1S and 2S are shaped to be long in the layering direction of the laser bar, and since separate optical systems are used for shift and alignment, respectively, an individual optical system has a simple configuration.

12 Claims, 16 Drawing Sheets

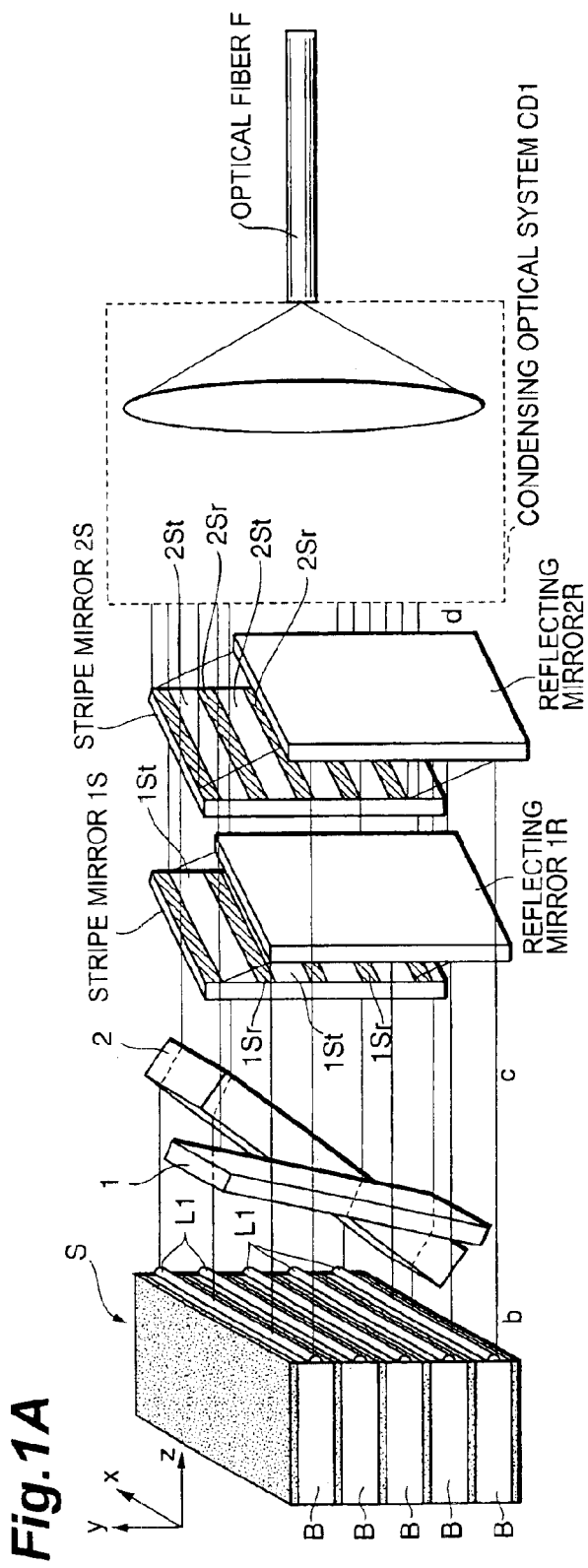
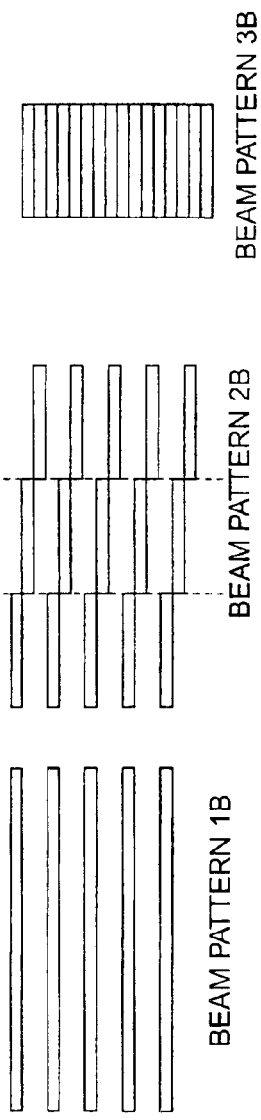

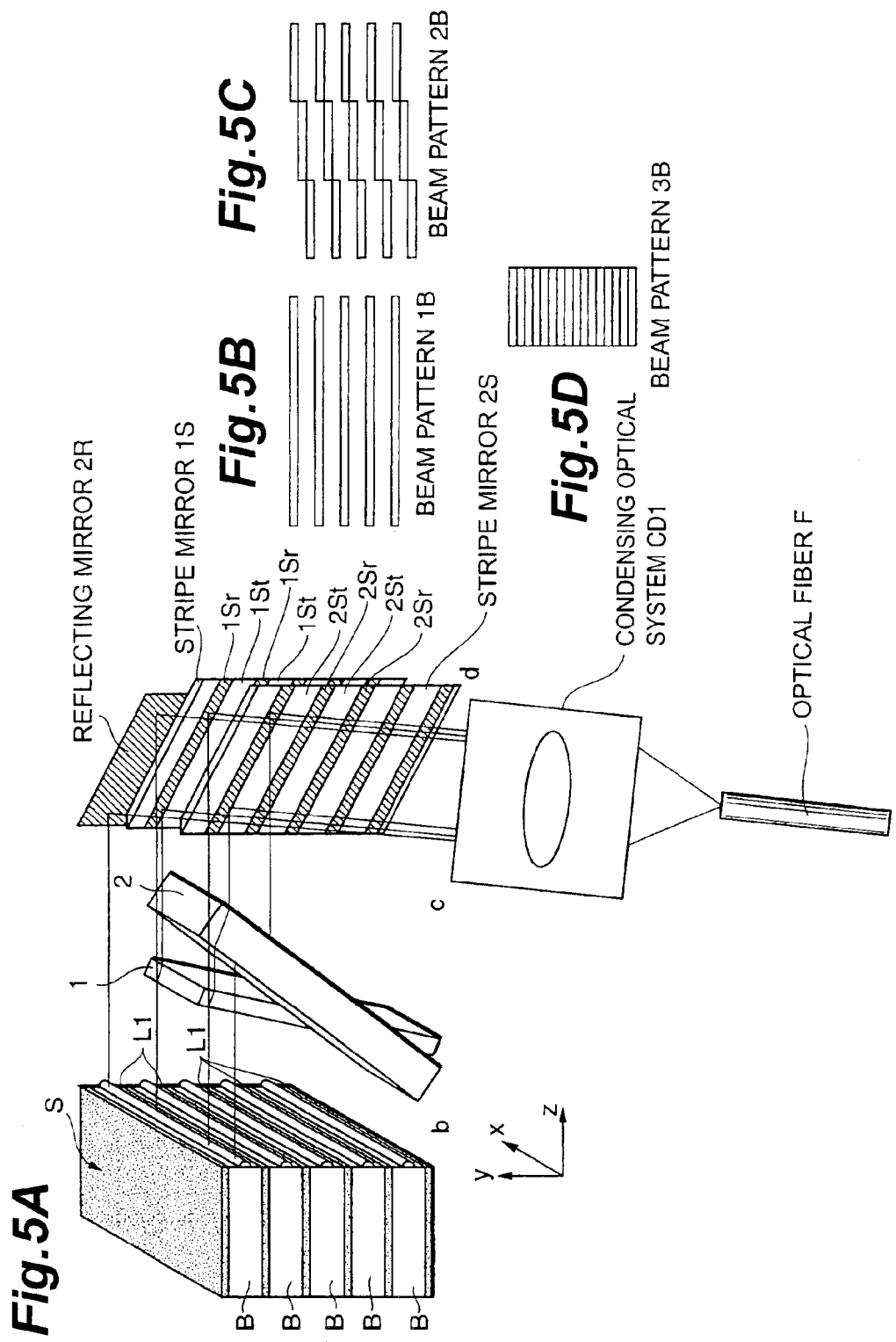

Fig.6A
Fig.6B
Fig.6CND BEAM PATTERN 2B
Fig.6D BEAM PATTERN 3B
Fig.6E REFLECTING MIRROR 2R / STRIPE MIRROR 1S / OPTICAL FIBER F
Fig.6F REFLECTING MIRROR 2S / 45°
Fig.6G 45° / 3G

Labels in Fig.6B: GLASS 2, REFLECTING MIRROR 2R, STRIPE MIRROR 1S, ADHESIVE AD, GLASS BODY 2G, BEAM PATTERN 1B, STRIPE MIRROR 2S, ADHESIVE AD, PRISM 3G, CONDENSING OPTICAL SYSTEM CD1

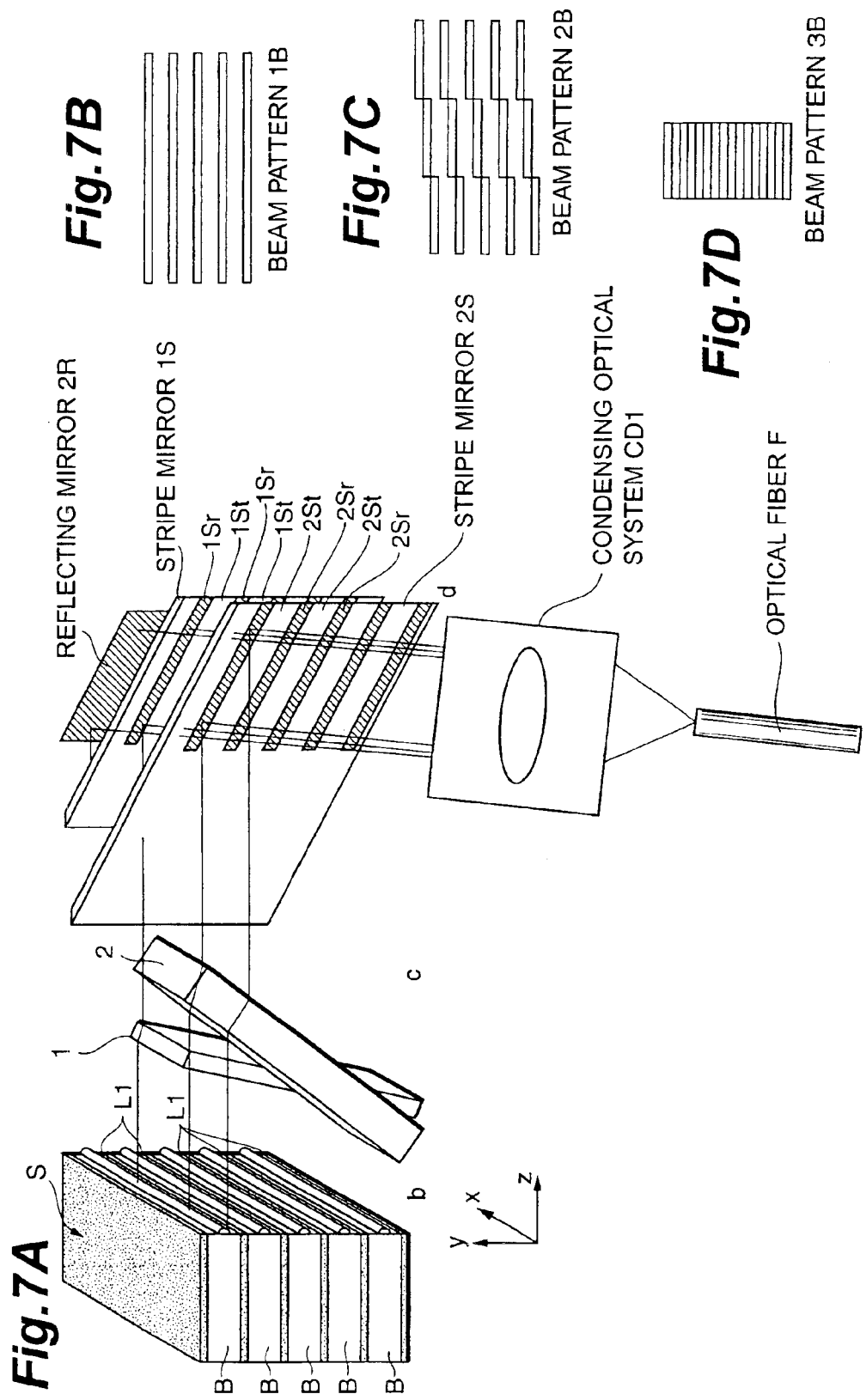

LASER LIGHT SOURCE AND AN OPTICAL SYSTEM FOR SHAPING LIGHT FROM A LASER-BAR-STACK

RELATED APPLICATION

This is a continuation-in-part application of application Ser. No. 10/360,642 filed on Feb. 10, 2003, now abandoned.

BACKGROUND OF THE INVENTION

1. Field of the Invention

The present invention relates to a laser light source and an optical system for shaping light from a laser-bar-stack.

2. Related Background Art

Optical systems to shape a laser beam group from a laser bar have been proposed. Condensing optical devices such as those described in Japanese patent application Laid-Open No. H10-502746 (international patent application) and Japanese Patent application Laid-Open No. H10-508122 (international patent application) have been proposed, but all are for supporting one laser bar. The shaping optical system according to the Japanese Patent application Laid-Open No. H10-502746 positions half of the output laser beam groups at a predetermined position by changing the direction thereof by a prism, and positions the other half of the output laser beam groups at a position below the above mentioned half of the laser beam groups.

SUMMARY OF THE INVENTION

In this case, a laser beam group is shaped by using a prism which performs complicated refraction and reflection, so if this shaping is applied to a laser bar layered product, the prism blocks optical paths of the laser beam group. With the foregoing in view, it is an object of the present invention to provide a shaping optical system for a laser bar layered product (stack) which can shape a laser beam pattern from a semiconductor laser bar layered product so as to be long in the layering direction, and a laser light source.

To solve the above problem, a shaping optical system for a laser bar layered product of the present invention targets a shaping optical system for a laser bar layered product for shaping laser beams from a laser bar layered product in which a plurality of laser bars, each of which is comprised of a plurality of semiconductor laser elements arrayed one-dimensionally, are layered along a direction which is vertical to both the array direction of the semiconductor laser elements and the laser beam traveling direction.

Here the light emitted from an individual semiconductor laser element is a laser beam and a group including a plurality of laser beams is called a "laser beam group".

The present shaping optical system for a laser bar layered product comprises a refracting optical system where a first laser beam group is the laser beam group on one side of the laser beam group output from the laser bar layered product with a line segment along the direction of layering as a boundary line, and a second laser beam group is the laser beam group on the other side, and the second laser beam group is relatively shifted together with respect to the first laser beam group along the direction of layering, and a transmission/reflecting optical system which reflects the first and second laser beam groups so that the shifted first and second laser beam groups align along the direction of layering.

In the refracting optical system, the second laser beam group is relatively shifted together with respect to the first laser beam group along the direction of layering, and also a transmission/reflecting optical system for alignment is used, so a laser beam pattern comprised of the first and second laser beam groups emitted from the transmission/reflecting optical system is aligned so as to be long in the direction of layering of the laser bar, and since different optical system is used for shifting and aligning, the configuration of an individual optical system is simple.

A plane parallel glass element can be used for the refracting optical system with a simple configuration. In this case, a normal line exists in a plane including a traveling direction of at least one of the first and second laser beam groups and the direction of layering, and forms a predetermined angle with the traveling direction. In other words, the laser beam which enters into the parallel glass plates shift position in the layering direction when the laser beam is emitted.

The transmission/reflecting optical system with a simple configuration comprises a first reflecting element which reflects one of the first and second laser beam groups on a plane including the array direction and the traveling direction, and a second reflecting element which the laser beam group reflected by the first reflecting element enters, wherein the second reflecting element further comprises a reflecting area for reflecting one of the first and second groups, and a transmission area for transmitting the other, which are alternately formed in stripes along the direction of layering.

By reflecting one of the laser beam groups by the first reflecting element, both the first and second laser beam groups enter the second reflecting element from different directions, however one of them is reflected by the reflecting area and the other transmits the transmission area, as a result, the degree of matching of the traveling direction of the first and second laser beam group emitted from the second reflecting element increases.

It is preferable that the length of the transmission area along the array direction is longer than the length along the array direction of the laser beam group which transmits the transmission area. In other words, at the edge of the transmission/reflecting optical system, the incident light which enters here does not perform target reflection where transmittance drops. So by increasing the length of the transmission area made of such a solid as glass, the laser beam group does not enter the edges, and therefore the transmittance of the transmission area can be improved.

The optical path of the laser beam group which transmitted through the glass becomes shorter. So it is preferable that a plane parallel glass element further comprises a first plane parallel glass plate which is used with a light transmission space, and is set such that one of the first and second laser beam groups which has a shorter optical path up to the emission position of the transmission/reflecting optical system transmits the first plane parallel glass plate, and the other which has a long optical path transmits the light transmission space. By this, the optical path length of the first and second laser beam groups up to the transmission/reflecting optical system can be aligned.

A configuration where both laser beam groups transmit the glass plate is also possible. In other words, the plane parallel glass element further comprises a first plane parallel glass plate and a second plane parallel glass plate which is thicker than the first plane parallel glass plate, and is set such that one of the first and second laser beam groups which has a shorter optical path up to the emission position of the transmission/reflecting optical system transmits the second plane parallel glass plate, and the other which has a longer optical path transmits the first plane parallel glass. By this, the optical path length of the first and second laser beam groups up to the transmission/reflecting optical system can be aligned.

Here the thickness of each glass controls not only the optical path length, but also the amount of shift of each laser beam group in the layering direction. In other words, the amount of shift depends on the thickness of the glass and the tilt angle of the glass. So the amount of shift and the optical path length can be independently controlled if the thickness of the glass is set so that the optical path lengths match, and then the above tilt angle is set so that a desired amount of shift can be obtained with glass having these thicknesses. In other word, from this point of view it is preferable that the first and second plane parallel glass plates are physically independently elements.

When the difference in the optical path length is not considered, however, the first and second plane parallel glass plates can be integrated, so that the shift error between laser beam groups caused by these glasses can be minimized. The optical path length, of course, may be compensated by using a different element.

It is also possible that the refracting optical system is a prism which relatively shifts at least one of the first and second laser beam groups together with respect to the other only in the direction of layering. In this case, the configuration is simplified since the prism shifts only in one direction.

The laser light source of the present invention comprises the above mentioned shaping optical system for a laser bar layered product on the laser beam groups emitted from the laser bar layered product.

BRIEF DESCRIPTION OF THE DRAWING

FIG. 1A is a perspective view of a device which shapes and condenses beams of a semiconductor laser bar layered product according to the first embodiment.

FIG. 1B shows a laser beam pattern of the laser beam group after collimation at position "b" in FIG. 1A.

FIG. 1C shows a laser beam pattern of the laser beam group after transmitting the plane parallel glass plates 2 and 1 and the light transmission space at position "c" in FIG. 1A.

FIG. 1D shows a laser beam pattern of the laser beam group after emitting from the stripe mirror 2S at position "d" in FIG. 1A.

FIG. 5A is a perspective view of the device which shapes and condenses beams of a semiconductor laser bar layered product according to the second embodiment.

FIG. 5B, FIG. 5C and FIG. 5D show the laser beam patterns of the laser beam group at the positions "b", "c" and "d" in FIG. 5A respectively.

FIG. 6A is a perspective view of the device which shapes and condenses the beams of a semiconductor laser bar layered product according to the third embodiment.

FIG. 6B, FIG. 6C and FIG. 6D show the laser beam patterns of the laser beam group at the positions "b", "c" and "d" in FIG. 6A respectively.

FIG. 6E, FIG. 6F and FIG. 6G are diagrams depicting the glass bodies 1G, 2G and 3G where a metal film is disposed respectively viewed from the y direction.

FIG. 7A is a perspective view of the device which shapes and condenses the beams of a semiconductor laser bar layered product according to the fourth embodiment.

FIG. 7B, FIG. 7C and FIG. 7D show the laser beam pattern of the laser beam group at positions "b", "c" and "d" in FIG. 7A.

DESCRIPTION OF THE PREFERRED EMBODIMENT

Figure 2:
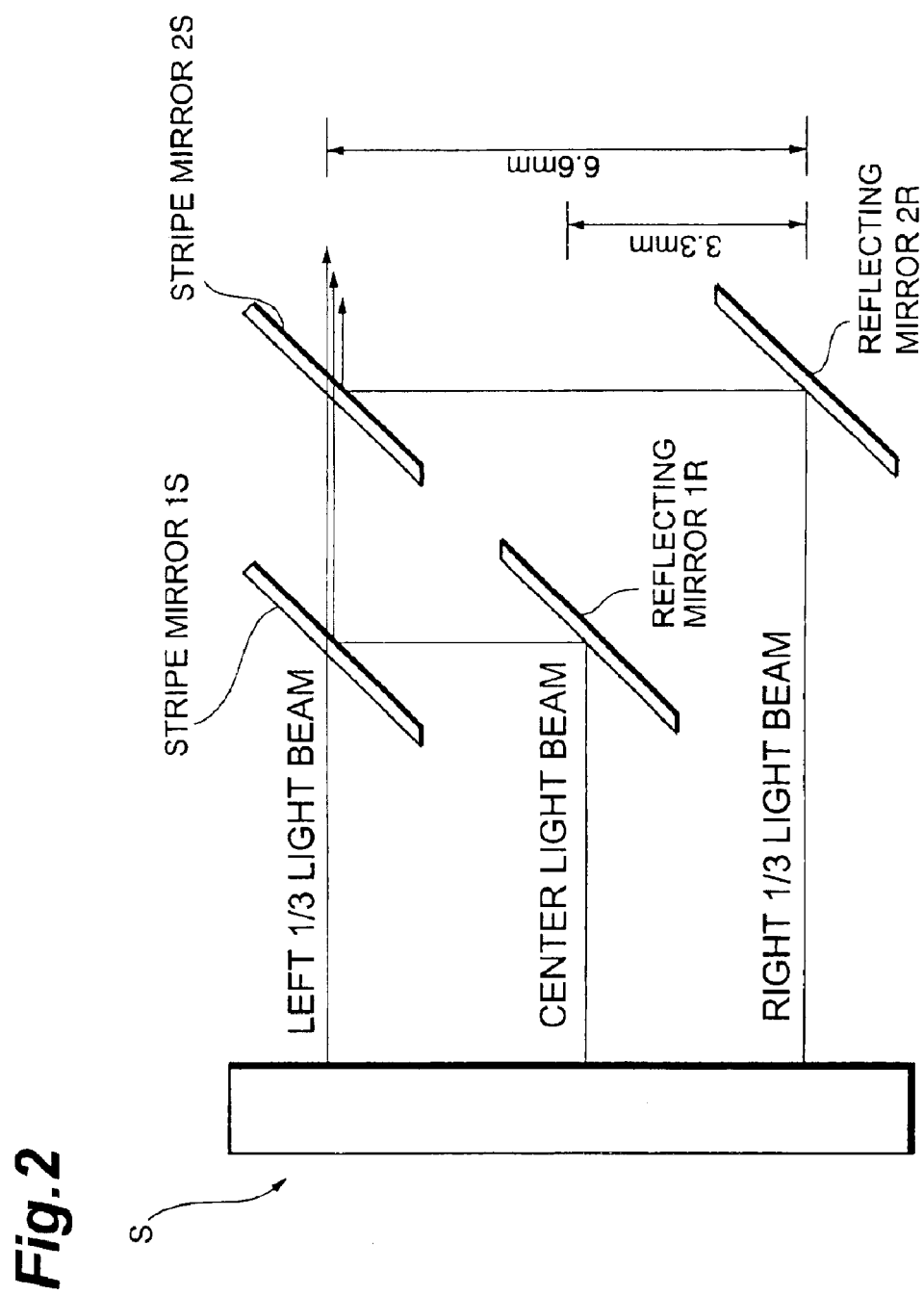
FIG. 2 is a diagram depicting a traveling path of beams in the x-z plane.

Embodiments of the shaping optical system for a laser bar layered product according to the present invention will now be described. The same numerals are used for the same elements, for which redundant descriptions are omitted.
(First Embodiment)

FIG. 1A is a perspective view of a device which shapes and condenses beams of a semiconductor laser bar layered product according to the first embodiment. A semiconductor laser bar (array) B is a plurality of semiconductor laser elements arrayed one-dimensionally. "x direction" is the array direction of the semiconductor laser elements in each laser bar B. "z direction" is the traveling direction of a laser beam emitted from the semiconductor laser element. And the "y direction" is a direction vertical to both the x direction and the z direction. The semiconductor laser bar layered product S is a plurality of laser bars B layered in the y direction. A heat sink is disposed between each laser bar B if necessary.

The shaping optical system for a laser bar layered product according to the present invention is intended to target the shaping optical system for a laser bar layered product which shapes laser beams from a laser bar layered product where a laser bar B, which is comprised of a plurality of semiconductor laser elements arrayed one-dimensionally is layered a plurality of times along the direction (y) which is vertical to both the array direction (x) of the semiconductor laser element and the traveling direction (z) of the laser beam.

A beam emitted from each semiconductor laser element is called "a laser beam", and a group including a plurality of laser beams is called "a laser beam group". Each laser beam is a divergent beam (the divergent angle in the y direction is max. 60°). Each laser beam emitted from the laser bar B is collimated in the y direction by a collimator lens (microlens) L1. Each collimated laser beam is shaped to a cycle in the y direction: 2.1 mm, a beam width in the y direction: 0.7 mm and a beam width in the x direction: 10 mm.

FIG. 1B shows a laser beam pattern of the laser beam group after collimation at position "b" in FIG. 1A.

Here two boundary lines BL1 and BL2, which are in parallel in the y direction, are set on the light emitting surface of the semiconductor laser bar layered product S, and the light emitting surface is divided into three (see FIG. 1C).

The laser beam group at the left of the boundary line BL1 located at the left of the light emitting surface enters the plane parallel glass plate 2 disposed on the extended area, ⅓ at the left side of the light emitting surface. The laser beam group located at this left side area shifts for ⅔ of the layering cycle (2.1 mm) of the laser bar B, that is, 1.4 mm, in the y direction by the plane parallel glass plate 2.

The laser beam group between the two boundary lines BL1 and B12 on the light emitting surface enter the plane parallel glass plate 2 disposed on the extended area, ⅓ at the center of the light emitting surface. The laser beam group located at this center area shifts to ⅓ of the layering cycle (2.1 mm) of the laser bar B, that is, 0.7 mm, in the y direction by the plane parallel glass plate 1.

The laser beam group at the right of the boundary line BL2 located at the right of the light emitting surface transmits the light transmission space located at the extended area, ⅓ at the right side of the light emitting surface, and the laser beam group located at this right side area reaches the optical system at a subsequent step without being deflected.

FIG. 1C shows a laser beam pattern of the laser beam group after transmitting the plane parallel glass plates 2 and 1 and the light transmission space at position "c" in FIG. 1A. According to this laser beam pattern, the laser beam group at the left, the laser beam group at the center, and the laser beam group at the right are shifted for ⅓ of the space in the y direction of the stripe patterns emitted from each laser bar B respectively. FIG. 1C shows the pattern viewed from the light traveling direction, and the left and right of the pattern are reversed with respect to the semiconductor laser bar layered product S.

FIG. 2 is a diagram depicting a traveling path of beams in the x-z plane. Now the traveling path of the laser beam group will be described, referring to FIG. 1A when necessary using corresponding numerals and signs.

The laser beam group in the area at the left transmits the transmission areas 1St and 2St of the stripe mirrors 1S and 2S sequentially, and emits from the stripe mirror 2S without changing the traveling direction.

The laser beam group at the center area is reflected in the x-z plane in the x direction by the reflecting element (mirror) and enters the reflection area 1Sr of the stripe mirror 1S. The respective normal line of the reflecting element 1R and the stripe mirror 1S satisfy the relationship x=−z in the x-z plane, so the incident angle and the emission angle of the laser beam group to these mirrors are 45°, and the laser beam group is reflected by the reflection area 1Sr of the stripe mirror 1S, and travels in the z direction. Then this laser beam group transmits the transmission area 2St of the stripe mirror 2S, and is emitted from the stripe mirror 2S together with the laser beam group at the left area without changing the traveling direction.

The laser beam group at the right side area is reflected in the x-z plane in the x direction by the reflecting element (mirror) 2R and enters the reflection area 2Sr of the stripe mirror 2S. The respective normal line of the reflecting element 2R and the stripe mirror 2S satisfy the relationship x=−z in the x-z plane, so the incident angle and the emission angle of the laser beam group to these mirrors are 45°, and the laser beam group at the right side area is reflected by the reflection area 2Sr of the stripe mirror 2S, and travels in the z direction together with the laser beam groups at the left and center areas.

FIG. 1D shows a laser beam pattern of the laser beam group after emitting from the stripe mirror 2S at position "d" in FIG. 1A. Compared with the laser beam pattern 1B shown in FIG. 1B, the width of the laser beam pattern 3B in the x direction is ⅓ the width of the laser beam pattern 1B. The laser beam group synthesized by the above mentioned mirrors are condensed by the condensing optical system CD1, and enter the end face of the optical fiber F disposed at the condensing position. When this device is not used, the size of the pattern after condensing is 1.7 mm×0.3 mm at N.A.=0.35. The size of the pattern when a prototype is used is 0.57 mm×0.3 mm.

The present shaping optical system for a laser bar layered product where a first laser beam group is the laser beam group at one side of the laser beam group output from the laser bar layered product S with a line segment along the direction of layering (y) as a boundary line and the second laser beam group is the laser beam group on the other side, comprises refracting optical systems 1 and 2 which relatively shift the second laser beam group together with respect to the first laser beam group along the direction of layering, and a transmission/reflecting optical system 1R, 2R, 1S and 2S, which reflect the first and second laser beam groups so that the shifted first and second laser beam groups align along the direction of layering.

The refracting optical systems 1 and 2 relatively shift the second laser beam group together with respect to the first laser beam group in the direction of layering, and the transmission/reflecting optical systems for alignment 1R, 2R, 1S and 2S are used, so the laser beam pattern comprised of the first and second laser beam groups emitted from the transmission/reflecting optical systems 1R, 2R, 1S and 2S is shaped so as to be long in the layering direction of the laser bar, and since the optical systems for shift and alignment are different, an individual optical system has a simple configuration.

According to the present invention, the plane parallel glass elements 1 and 2 are disclosed as a refracting optical system with a simple configuration. In this case, the normal lines of the plane parallel glass elements 1 and 2 exist in a plane including a traveling direction (z) of at least one of the first and second laser beam groups and the direction of layering (y), and forms a predetermined angle θa with the traveling direction (z). In other words, when the laser beam which enters the parallel glass plates emits, the position in the layering direction has been shifted.

According to the present embodiment, the transmission/reflecting optical system with a simple configuration is comprised of a first reflecting element 1R (or 2R) which reflects one of the first and second laser beam groups in a plane including the array direction (x) and the traveling direction (z), and a stripe mirror (second reflecting element 1S (or 2S)) where the laser beam group reflected by the first reflecting element 1R enters, wherein the second reflecting element 1S (or 2S) is further comprised of a reflection area 1Sr (or 2Sr) for reflecting one of the first and second laser beam groups and a transmission area 1St (or 2St) for transmitting the other, which are alternately formed in stripes along the direction of layering (z).

When one laser beam group is reflected by the first reflecting element 1R (2R), both the first and second laser beam groups enter the second reflecting element 1S (2S) from different directions (see FIG. 2), but one is reflected by the reflection area 1Sr (2Sr) and the other transmits the transmission area 1St (2St), so the traveling directions of the first and second laser beam groups emitted from the second reflecting elements 1S (2S) match more closely.

Figure 3:
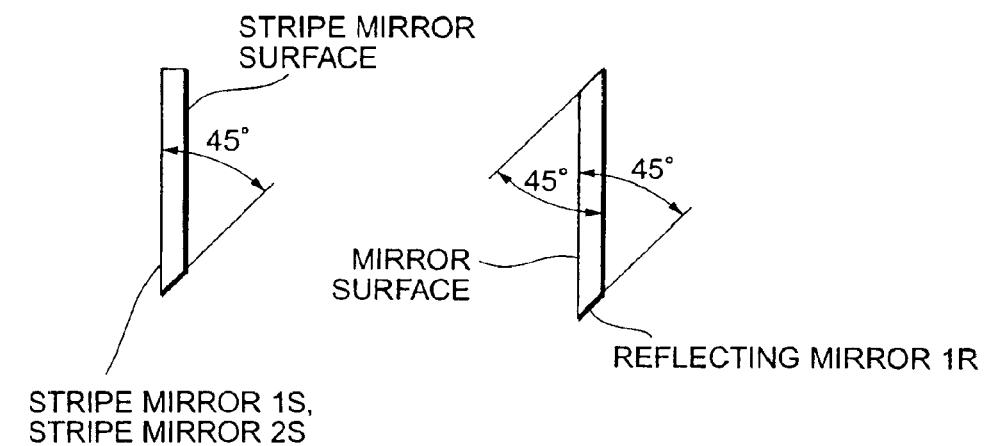
FIG. 3A is a diagram depicting the stripe mirror 1S and the stripe mirror 2S viewed from the y direction.
FIG. 3B is a diagram depicting the reflecting element 1R viewed from the y direction.

FIG. 3A is a diagram depicting the stripe mirror 1S and the stripe mirror 2S viewed from the y direction. FIG. 3B is a diagram depicting the reflecting element 1R viewed from the y direction. The end faces in the x-z plane of each mirror have been polished 45° with respect to the surface. This is for controlling the scattering of the laser bam from the semiconductor laser element by the end face of the mirror.

Figure 4:
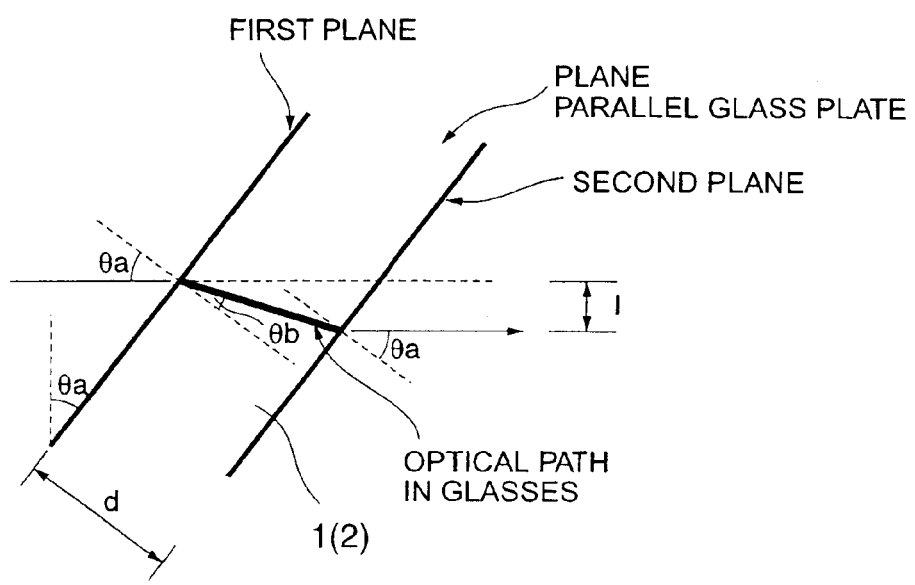
FIG. 4 is a diagram depicting the amount of the shift in the y axis direction when the beam enters the plane parallel glass plates 1 and 2.

FIG. 4 is a diagram depicting the amount of the shift in the y axis direction when the beam enters the plane parallel glass plates 1 and 2. FIG. 4 shows the plane parallel glass plate 1 or 2. The beam enters the plane parallel glass plate which thickness is d and the refractive index is n at incident angle $\theta a$. The incident light is reflected at $\theta b$ by the first plane, and is emitted at $\theta a$ from the second plane. Therefore the emitting light is in parallel with the incident light, but is emitted with the following distance 1 shifted.

$$l = d \times (\sin(\theta_a - \sin^{-1}(\sin \theta_a/n))/\cos(\sin^{-1}(\sin \theta_a/n))) \quad (1)$$

The optical path length of the laser beam group which transmitted the glass becomes shorter. The thickness of the plane parallel glass plate 1 and the plane parallel plate 2 are different in order to correct the optical path differences among the above mentioned three optical paths to be zero. As FIG. 2 shows, the width in the x direction of the optical path in the left side area is 6.6 mm shorter than that of the optical path in the right side area. The optical path in the center area is 3.3 mm shorter than the optical path in the left side area. So the optical path of the plane parallel glass plates shown in FIG. 4 is calculated by the following formula.

$$\text{Optical Path} = \{d \times (1 - 1/n)\}/\cos(\sin^{-1}(\sin\theta_a/n)) \quad (2)$$

In the case of focusing on the plane parallel glass plate 1 on one side and the light transmission space adjacent to the glass plate 1, the plane parallel glass element comprises the first plane parallel glass plate 1 which is used with the light transmission space, wherein one of the first and second laser beam groups (right or center laser beam group), which ever has a shorter optical path to reach the emission position of the transmission/reflecting optical system 2S (center laser beam group), transmits the first plane parallel glass plate 1, and one which has a longer optical path transmits the light transmission space. As a result, the optical path length of the first and second laser beam groups up to the transmission/reflecting optical system can be matched.

In the case of focusing on both the plane parallel glass plates 1 and 2, and both laser beam groups which transmit the plane parallel glass plates 1 and 2, the plane parallel glass element comprises a first plane parallel glass plate 1 and a second plane parallel glass plate 2 which is thicker than the first plane parallel glass plate 1, wherein the first or second laser beam groups (center laser beam group or left laser beam group), which ever the optical path to the emission position of the transmission/reflecting optical system is shorter (left side laser beam group), transmits through the second plane parallel glass plate 2, and the other one which the optical path is longer transmits the first plane parallel glass plate 1. As a result, the optical path length of the first and second laser beam groups up to the emission position of the transmission/reflecting optical system can be matched.

The thickness of each glass controls not only the optical path length but also the amount of shift of each laser beam group in the layer direction. In other words, the amount of shift depends on the thickness of the glass and the tilt angle of the glass. So at first, the thickness of each glass is set so that the optical path lengths match, and the above mentioned tilt angle is set next so that a desired amount of shift is obtained by the glass with this thickness, then the amount of shift and the optical path length can be independently controlled. In other words, in terms of this aspect, it is preferable that the first and second plane parallel glass plates 1 and 2 are physically independent elements.

In the present embodiment, the angle $\theta a$ and the thickness of the glass plate 2 in the left side area and the glass plate 1 in the center area are 12°, 15 mm and 12°, 7.5 mm respectively by the formula (1) and (2) (refractive index: n=1.8). In this example, the angle $\theta a$ of the glass plate 1 and the glass plate 2 are the same, however needless to say, the optical path length and the amount of shift are determined by appropriately setting the refractive index, angle and thickness of the glasses.

(Second Embodiment)

FIG. 5A is a perspective view of the device which shapes and condenses beams of a semiconductor laser bar layered product according to the second embodiment. In the first embodiment, four mirrors are used for the transmission/reflecting optical system for synthesizing the laser beam groups, but in the present embodiment, three mirrors are used, which is the only difference, and the function thereof is the same as the first embodiment.

The structure of the semiconductor laser bar layered product S is the same as that of the first embodiment. The plane parallel glass plates 1 and 2 are disposed at positions which are symmetrical with respect to the y-z plane, which passes through the center of the layered product S.

The laser beam group in the left side area does not transmit through the plane parallel glass plates 1 and 2, but is reflected by the reflecting element 2R in the x direction, and then transmits the transmission area 1St and 2St of the stripe mirrors 1S and 2S sequentially, and is emitted from this transmission/reflecting optical system.

The laser beam group in the center area transmits the plane parallel glass plate 1, and is reflected by the reflecting area 1Sr of the stripe mirror 1S. Then transmits the transmission area 2St of the stripe mirror 2S, and is emitted from this transmission/reflecting optical system along with the laser beam group in the left side area.

The laser beam group in the right side area transmits the plane parallel glass plate 2, and is reflected by the reflecting area 2Sr of the stripe mirror 2S, then is emitted from this transmission/reflecting optical system along with the laser beam groups in the left side and the center area.

The laser beam groups synthesized by the above mentioned mirrors are condensed by the condensing optical system CD1, and enter the end face of the optical fiber F disposed at the condensing position.

FIG. 5B, FIG. 5C and FIG. 5D show the laser beam patterns of the laser beam group at the positions "b", "c" and "d" in FIG. 5A respectively. These laser beam patterns are the same as those in the first embodiment, and the laser beam patterns are shaped so as to be long in the y direction.

(Third Embodiment)

FIG. 6A is a perspective view of the device which shapes and condenses the beams of a semiconductor laser bar layered product according to the third embodiment. In the second embodiment, three mirrors are used for the transmission/reflecting optical system for synthesizing the laser beam groups, but in the present embodiment, the three mirrors are embedded in the glass body 1G, 2G and 3G, which is the only difference, and the function thereof is the same as the second embodiment. A reflecting element 2R is disposed on the rear face side of the glass body 1G, a stripe mirror 1S is disposed between the glass body 1G and the glass body 2G, and a stripe mirror 2S is disposed between the glass body 2G and the glass body 3G respectively as a metal film. In other words, the reflecting element and the stripe mirrors are the reflecting element thin film and the stripe mirror thin films respectively. An adhesive layer AD intervenes between these glass bodies 1G, 2G and 3G. The glass body 3G has a triangular prism shape.

In manufacturing this element, a reflecting element thin film and a stripe mirror thin film are deposited on both sides of the glass body 1G. Then the stripe mirror thin film is deposited only on one side of the glass body 2G. Then the glass body 1G, glass body 2G and prism 3G are bonded with transparent adhesive AD.

FIG. 6B, FIG. 6C and FIG. 6D show the laser beam patterns of the laser beam group at the positions "b", "c" and "d" in FIG. 6A respectively. FIG. 6E, FIG. 6F and FIG. 6G are diagrams depicting the glass bodies 1G, 2G and 3G where a metal film is disposed respectively viewed from the y direction. The end face in the x-y plane of each glass body is polished to 45° with respect to the surface of the metal film. This is for controlling the scattering of the laser beam from the semiconductor laser element by the end face of the mirror.

(Fourth Embodiment)

FIG. 7A is a perspective view of the device which shapes and condenses the beams of a semiconductor laser bar layered product according to the fourth embodiment. In the second embodiment, three mirrors are used for the transmission/reflecting optical system for synthesizing the laser beam groups, but in the present embodiment, the length of a mirror having a transmission function among the three mirrors is longer in the x-z plane, which is the only difference and the function thereof is the same as the second embodiment.

The length of the transmission areas 1St and 2St along the x direction in the stripe mirrors 1S and 2S is longer than the length of the laser beams along the x direction which transmits the transmission areas 1St and 2St.

Figure 8:
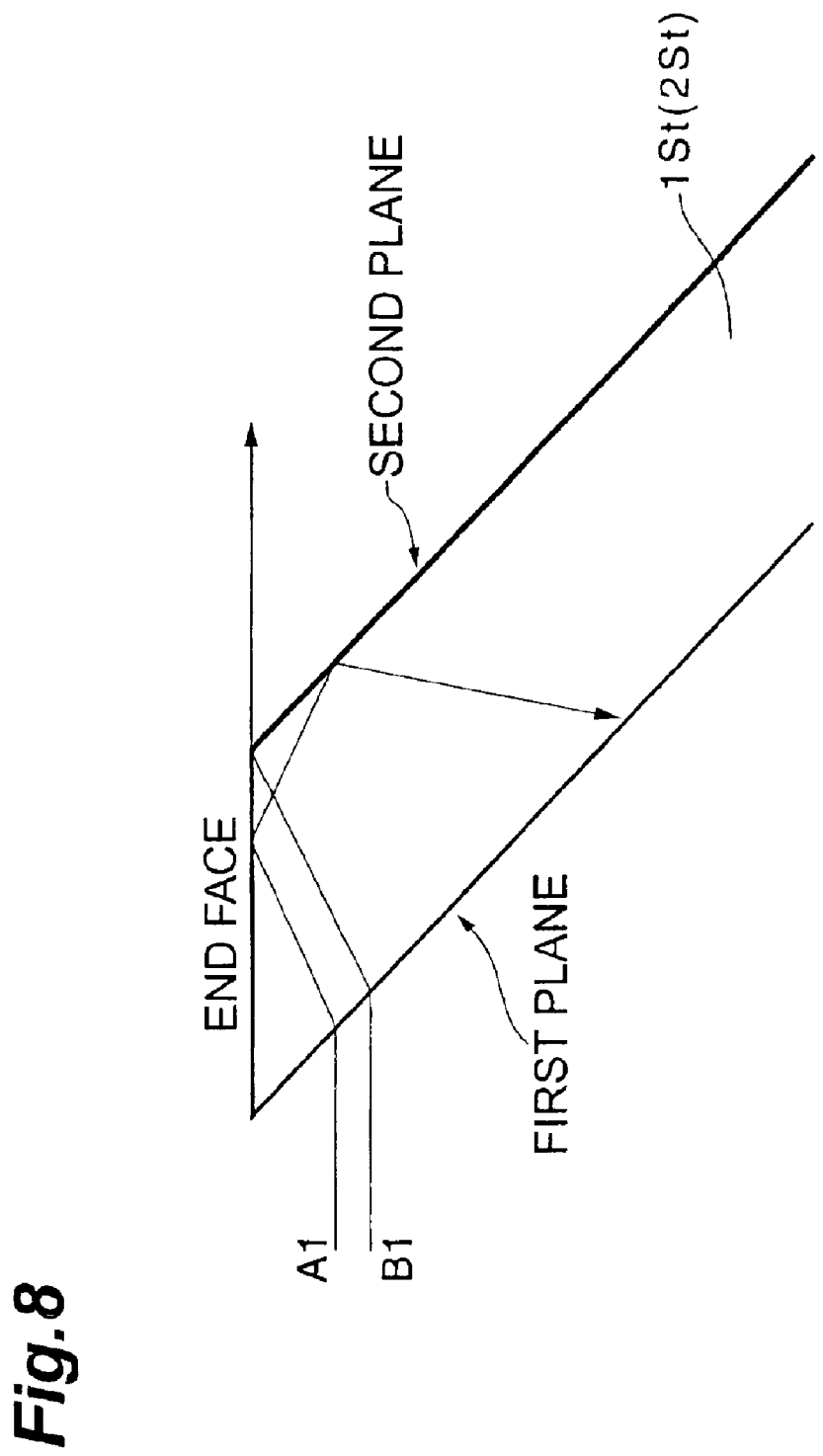
FIG. 8 is a diagram depicting an area near the end face of the transmission area 1St (2St) in the stripe mirror 1S (2S).

FIG. 8 is a diagram depicting an area near the end face of the transmission area 1St (2St) in the stripe mirror 1S (2S). Normally a laser beam enters the first plane as shown in the beam B1, and emits from the second plane in parallel with the incident beam. However, the beam A1 which enters the first plane closer to the end face enters the end face and changes direction, which causes a loss of light. Therefore as FIG. 7A shows, the length of the transmission areas 1St and 2St is increased, so that the laser beam groups do not enter the edge. As a result, the transmittance of the transmission areas 1St and 2St can be improved. The reflecting element 2R is the stripe mirror 1S here, but the stripe mirror 1S can be created on the incident plane of the glass plate, and the reflecting element 1R is created on the rear face.

FIG. 7B, FIG. 7C and FIG. 7D show the laser beam pattern of the laser beam group at positions "b", "c" and "d" in FIG. 7A. These laser beam patterns are the same as those in the first embodiment, and the laser beam patterns are shaped so as to be long in the z direction.

(Fifth Embodiment)

Figure 9:
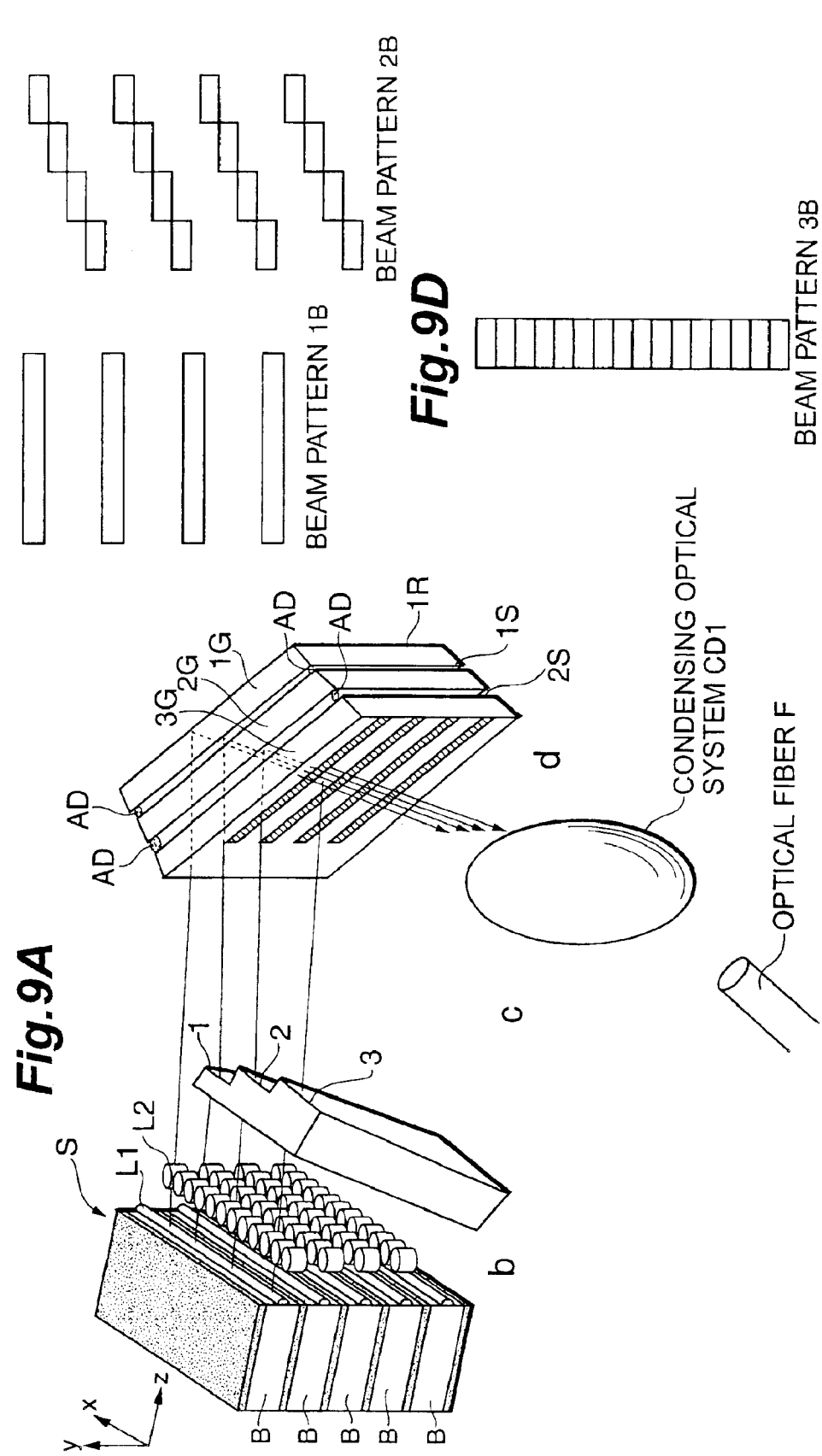
FIG. 9A is a perspective view of the device which shapes and condenses beams of a semiconductor laser bar layered product according to the fifth embodiment.
FIG. 9B, FIG. 9C and FIG. 9D show the laser beam patterns of the laser beam group at positions "b", "c" and "d" in FIG. 9A.

FIG. 9A is a perspective view of the device which shapes and condenses beams of a semiconductor laser bar layered product according to the fifth embodiment. In the fourth embodiment, three mirrors are used for the transmission/reflecting optical system for synthesizing the laser beam groups, but in the present embodiment, (1) a collimator lens L2 is disposed in front of the collimator lens L1, (2) an integrated plane parallel glass element is used for the refracting optical system, and (3) three mirrors are embedded in the glass bodies where adhesive AD is intervened, just like the case in FIG. 6A, which are different from the fourth embodiment, but the function thereof is the same as the fourth embodiment.

FIG. 9B, FIG. 9C and FIG. 9D show the laser beam patterns of the laser beam group at positions "b", "c" and "d" in FIG. 9A. The laser beam pattern is divided into four, and is then shaped to be long in the y direction. When the present device is used, the size of the laser beam pattern after condensing is 0.43 mm×0.3 mm.

The laser beam emitted from the semiconductor laser bar layered product S in the y direction is collimated by the collimator lens L1 and the beam in the x direction is collimated by the collimator lens L2. A cross-section of the collimated laser beam group is in stripes. The cycle of the strips of the laser beam group is 2.1 mm in the y direction, the beam width in the y direction is 0.52 mm and the beam width in the x direction is 10 mm. The collimator lens L1 is designed so as to match this beam width in the y direction.

The plane parallel element used as the refracting optical system is comprised of the plane parallel glass plates 1, 2 and 3 with different thicknesses which are integrated. In the first embodiment, the optical path length can be adjusted by changing the tilt angle of the glass plates, but when the plane parallel glass plates 1, 2 and 3 are integrated, the optical path length is adjusted by the thickness of the glass plates. There are of course some cases when the optical path length is not adjusted. If the difference of the optical path length is not considered for the plane parallel glass plates, another material may be used for compensation. By the plane parallel glass plates 1, 2 and 3, the beam width in the x direction, 10 mm, is divided into four, which is 2.5 mm each, as shown in FIG. 9C, and the divided laser beam group is relatively shifted along the y direction.

The three mirrors, 1R, 1S and 2S, are embedded in the glass bodies 1G, 2G and 3G just like the case of FIG. 6A. For each mirror, a metal film is deposited on the front surface or rear surface of the respective glass body. Here, the adhesive AD is disposed avoiding the path of the laser beam. By this transmission/reflecting system, four laser beam groups, which are shifted in the y direction and isolated along the x direction are aligned in the y direction. The pattern size when the prototype of the present embodiment is used is 0.21 mm×0.3 mm.

As described above, the above mentioned device uses parallel plane glass plates for shaping the width of the beam in the x direction to be narrow, but the width of the beam can be easily decreased by increasing the number of plates. Also an example of dividing the laser beam pattern into three or four was shown above, but the laser beam pattern can be divided into n, and in this case the beam width in the x direction is 1/n. Unlike a conventional 1 array—1 condensing system, this condensing system is used for each layered product S, so a quite large plane parallel glass plate can be used. Therefore it is easy to increase the number of plane parallel glass plates.

(Sixth Embodiment)

Figure 10:
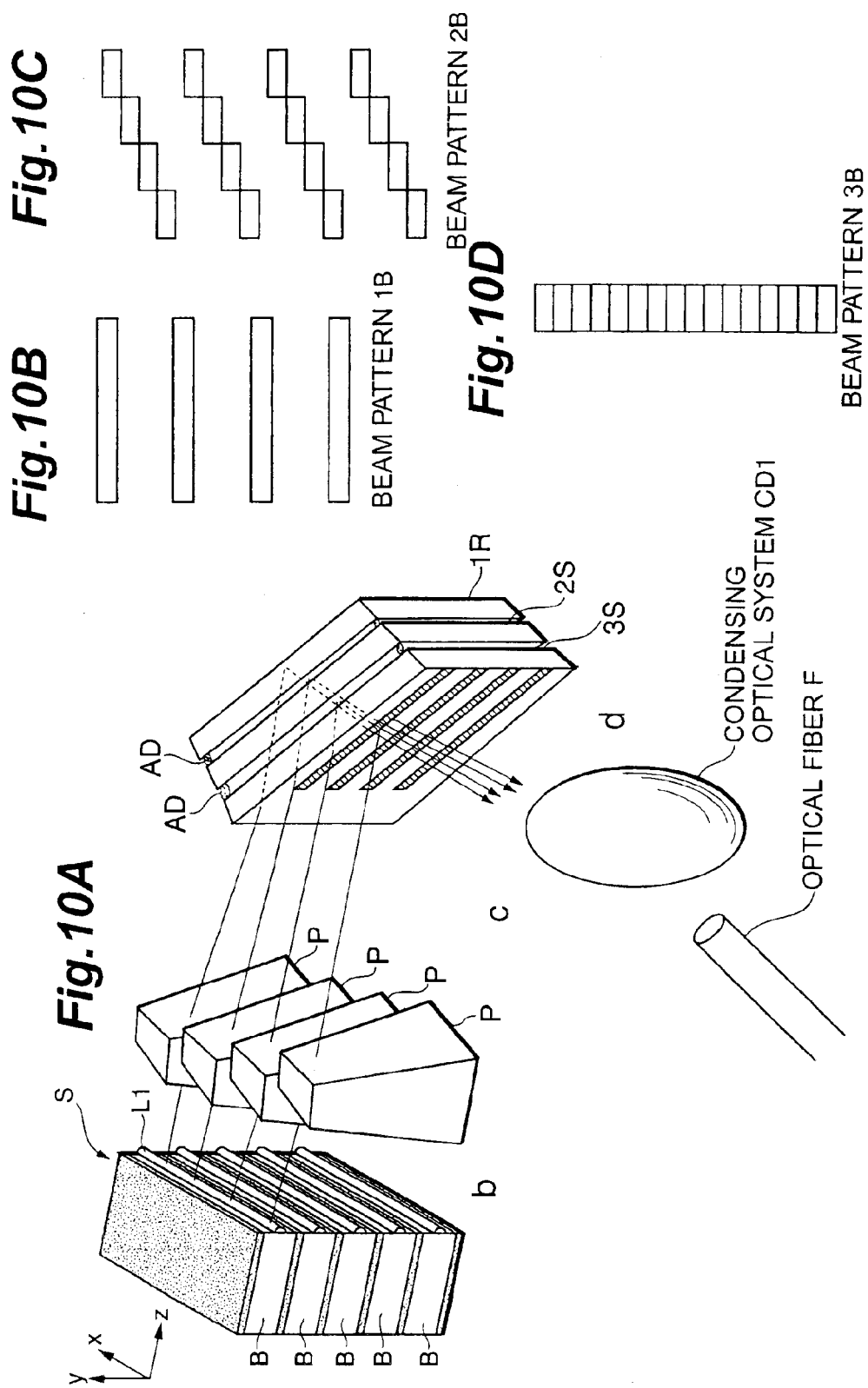
FIG. 10A is a perspective view of a device which shapes and condenses the beams of a semiconductor laser bar layered product according to the sixth embodiment.
FIG. 10B, FIG. 10C and FIG. 10D show the laser beam patterns of the laser beam group at positions "b", "c" and "d" in FIG. 10A.

FIG. 10A is a perspective view of a device which shapes and condenses the beams of a semiconductor laser bar layered product according to the sixth embodiment. The difference of the device of the present embodiment is that a prism is used instead of the refracting optical system comprised of the collimator lens L2 and the plane parallel glass elements 1, 2 and 3 in the fifth embodiment. The function is the same as that of the fifth embodiment. The prism P of the refracting optical system relatively shifts the adjacent beams of the laser beam groups divided into four together with respect to the other only in the y direction. In this case, the prism P shifts the beams only in one direction, so the configuration thereof is simple. In the present embodiment, the four prisms P are disposed for each laser beam group to be divided. Four prisms P are used, but unlike the plane parallel plates, the traveling direction of the laser beam after emitting the prism can be changed, which makes the device compact.

FIG. 10B, FIG. 10C and FIG. 10D show the laser beam patterns of the laser beam group at positions "b", "c" and "d" in FIG. 10A. The laser beam pattern is divided into four, then it shaped to be long in the z direction.

The above mentioned prism, reflecting elements, stripe mirrors and plane parallel glass plates can be integrated according to the above embodiment. With the above mentioned device, a beam can be shaped to be small, so the brightness of a laser beam increases and a fiber with a small aperture can be used, so operability increases when the fibers are used for a robot arm.

According to the shaping optical system for a semiconductor laser bar layered product and laser light source of the present invention, the laser beam pattern from the laser bar layered product can be shaped to be long in the layering direction.

As stated above, the laser light source comprises: a laser-bar-stack S emitting longitudinal laser beam patterns (see beam pattern 1B), the longitudinal laser beam patterns (see beam pattern 1B) being aligned along the stack direction; and means for distributing each of the longitudinal laser beam patterns (see beam pattern 2B) into a stepwise pattern; and means for closing up each of the stepwise patterns (see beam pattern 2B) along the longitudinal direction and forming a square pattern (see beam pattern 3B) as a whole.

(Seventh Embodiment)

Figure 11:
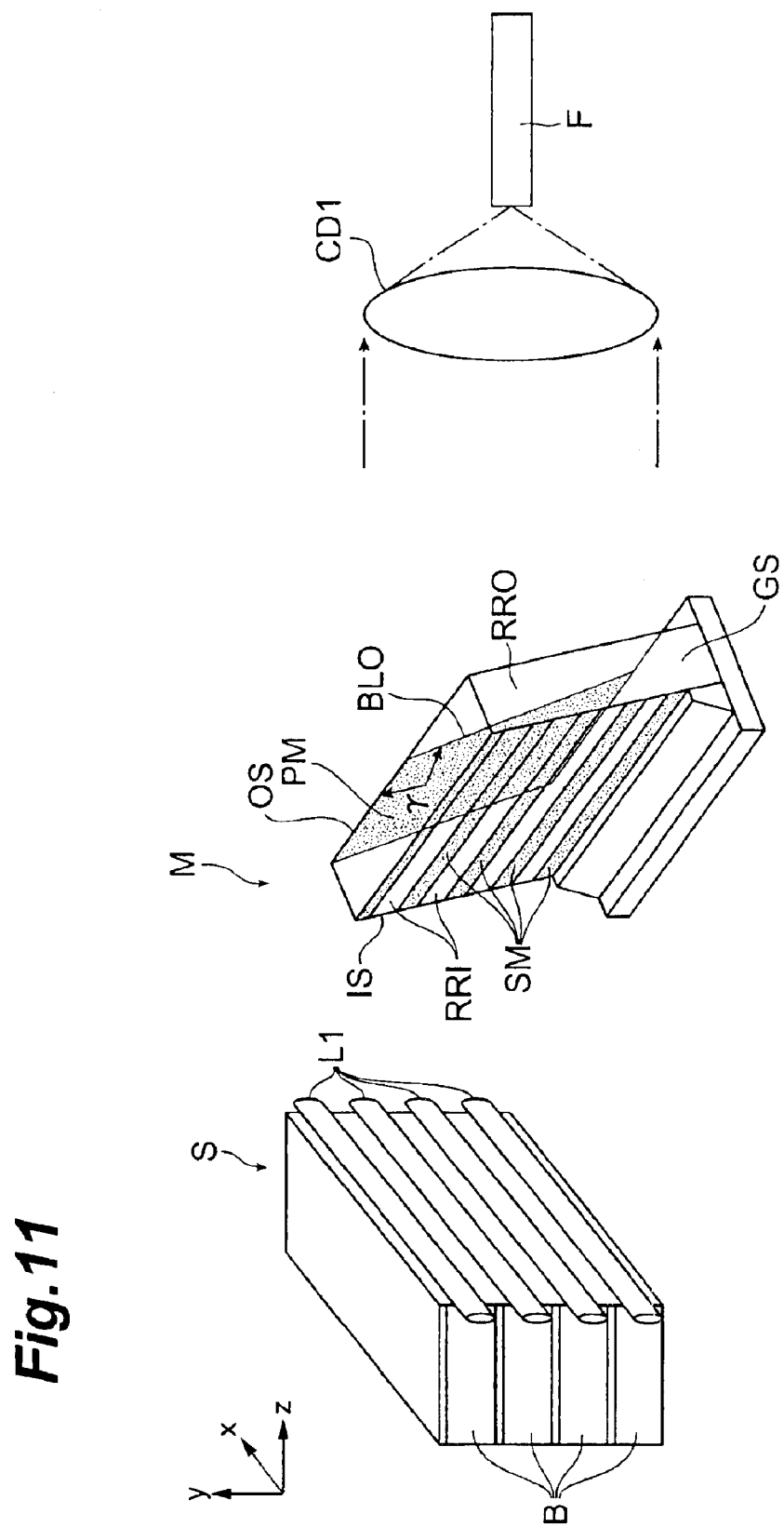
FIG. 11 is a perspective view of a device which shapes and condenses beams of a semiconductor laser bar layered product according to the seventh embodiment.

FIG. 11 is a perspective view of a device which shapes and condenses beams of a semiconductor laser bar layered product according to the seventh embodiment. The semiconductor laser bars (arrays) B each comprises a plurality of semiconductor laser elements arrayed one-dimensionally. The "x direction" is the array direction of the semiconductor laser elements in each laser bar B. The "z direction" is the direction of travel of a laser beam emitted from a semiconductor laser element. And the "y direction" is a direction perpendicular to both the x direction and the z direction. The semiconductor laser bar layered product S is a plurality of laser bars B layered in the y direction. A heat sink may be disposed between each laser bar B if necessary.

The shaping optical system for a laser bar layered product according to the present embodiment is a shaping optical system for a laser bar layered product which shapes laser beams from a laser bar layered product where a plurality of laser bars B, which comprises a plurality of semiconductor laser elements arrayed one-dimensionally, are layered a plurality of times along the y direction which is perpendicular to both the array x direction of the semiconductor laser element and the z direction of travel of the laser beam.

A beam emitted from each semiconductor laser element is called "a laser beam", and a group including a plurality of laser beams is called "a laser beam group". Each laser beam is a divergent beam (the divergent angle in the y direction is max. 60°). Each laser beam emitted from the laser bar B is collimated in the y direction by a collimator lens (microlens) L1. Each collimated laser beam is shaped to a cycle in the y direction: 1.5 to 2.1 mm, a beam width in the y direction: 0.3 to 0.7 mm and a beam width in the x direction: 10 to 12 mm.

The laser beam group emitted from the laser bar is shaped by the optical member M, condensed by the condensing optical system CD1 and enters the end of the optical fiber F. The optical member M is secured to a support member (holder). Each of the parts is arranged to cause the laser group to travel as follows:

The laser beams (laser beam pattern) emitted from one laser bar B is divided by a boundary line along y direction, the boundary line being set by the optical member M. These divided laser beam pattern elements are aligned along y direction. "β" is the number of this division. For example, when β=2, the laser beam pattern emitted from one laser bar B is divided by 2, when β=3, the laser beam pattern emitted from one laser bar B is divided by 3, when β=k, the laser beam pattern emitted from one laser bar B are divided by k.

Figure 12:
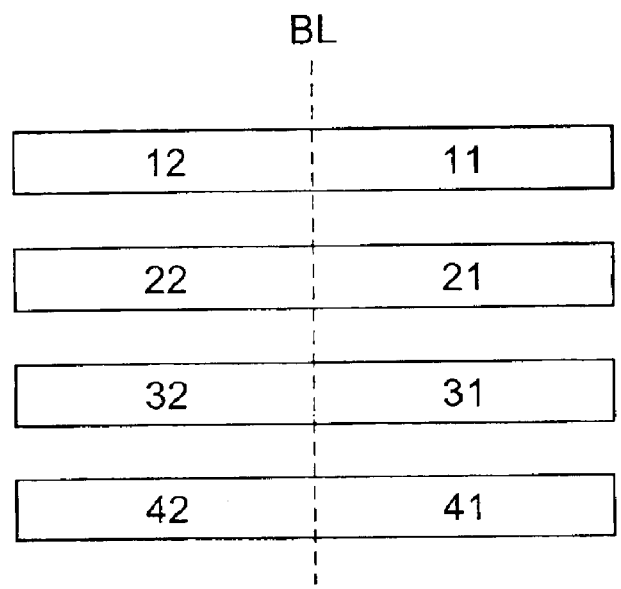
FIG. 12 is a figure showing the laser beam pattern of the laser beam group emitted from the laser bar layered product.
Figure 13:
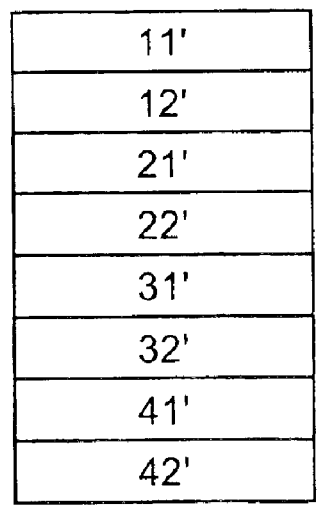
FIG. 13 is a figure showing the laser beam pattern after the above division($\beta$=2).

FIG. 12 is a figure showing the laser beam pattern of the laser beam group emitted from the laser bar layered product, the pattern being perpendicular to the beam propagating direction, and FIG. 13 is a figure showing the laser beam pattern after the above division (β=2). Note that a boundary line BL is set on the light emitting surface of the semiconductor laser bar layered product S, and this light emitting surface is divided into two equal parts.

The optical member M divides each laser beam pattern that is respectively emitted from a plurality of laser bars B layered, along the layering direction. The optical member M comprises one parallel glass plate and stripe mirror (stripe reflection films) SM formed on one surface (light incident surface) IS of the parallel glass plate GS and a reflection film PM formed on the other surface (light emitting surface) OS of the parallel glass plate GS.

The rest of the region where the stripe reflection film SM is formed on in the light incident surface IS, that is, regions RRI respectively positioned between the individual reflection films PM, consists of openings. An AR coating (reflection film: indicated by the same symbol RRI as the opening region) is formed in this opening.

Further, the rest (remaining region RRO) of the region where the reflection film PM is formed on in the light emitting surface OS also consists of an opening. An AR coating (reflection film: indicated by the same sign RRO as the opening) is formed in this opening.

The boundary line between the reflection film PM and the remaining region RRO is defined as BLO, and the angle formed by the boundary line BLO between the reflection film PM and the remaining region RRO and the longitudinal direction of the reflection film SM of the stripe reflection films SM is defined as γ (γ<180°).

The laser beam group (laser beam pattern elements) 11, 21, 31, 41 positioned at right side of the boundary line BL is transmitted through the opening RRI of the light incident surface IS of the optical member M, and through the opening RRO of the light emitting surface OS of the optical member M, and is emitted from the optical member M.

The laser beam group (laser beam pattern elements) 12, 22, 32, 42 positioned at left side of the boundary line BL is incident on the opening RRI of the light incident surface IS of the optical member M, and is reflected by the reflection film PM. After that, each the laser beam pattern element 12, 22, 32, 42 incident on a reflection film that is beneath their position of incidence and is reflected by each of the reflection films SM, and after that, transmitted through the opening RRO of the light emitting surface OS and are emitted from the optical member M.

As stated above, the respective laser beam patterns (11, 12), (21,22), (31,32), (41,42) emitted from the corresponding laser bars B are divided by the boundary line BL that extends along the y direction, the boundary line BL being set by the optical member M, and after that, the beams are aligned along the y direction.

That is, as shown in FIG. 13, the divided laser beams (laser beam patterns) 11', 12', 21', 22', 31', 32', 41', 42' are aligned along the y direction without any space between them.

This embodiment will be explained in more detail below.

Figure 14:
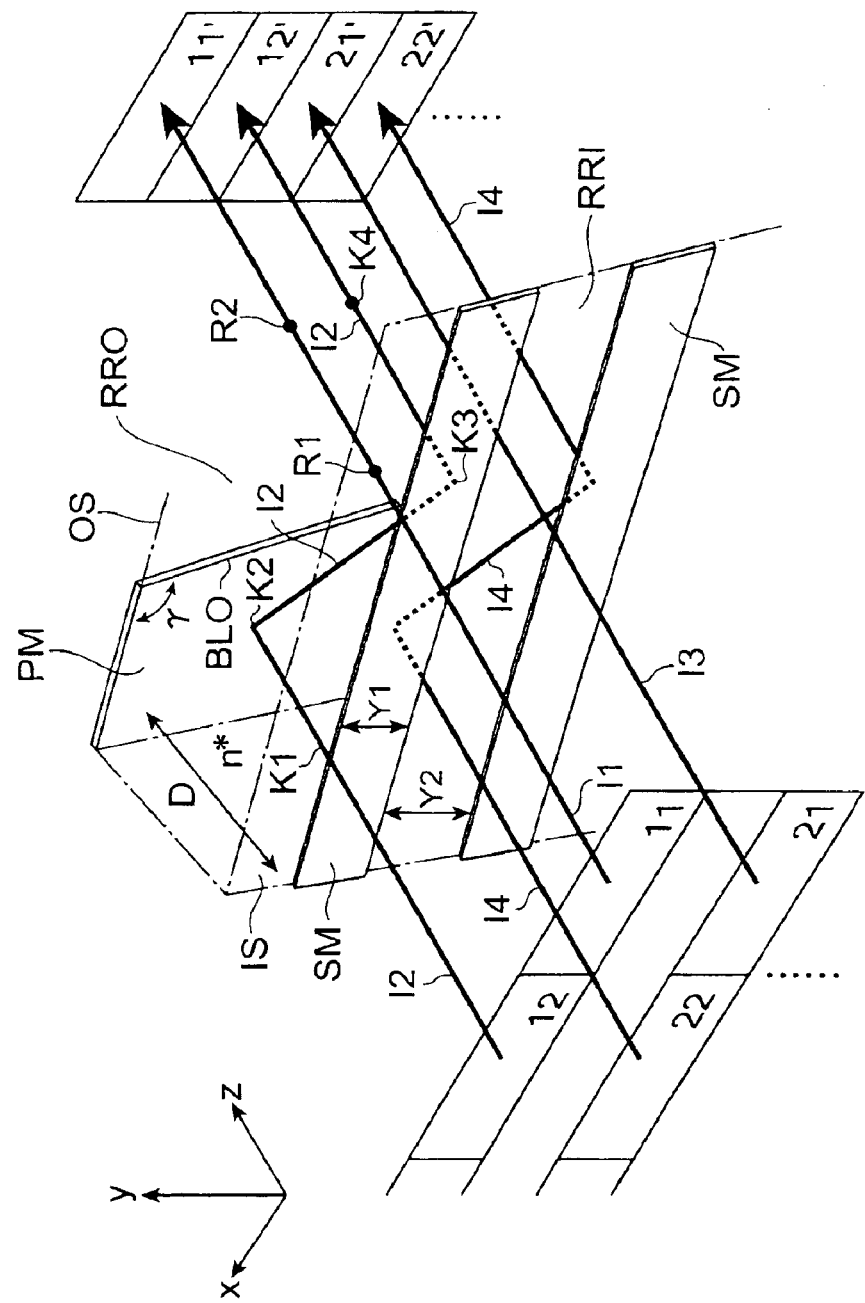
FIG. 14 is an explanation diagram showing the pathways of the laser beam group around the optical member M ($\beta$=2).

FIG. 14 is an explanation diagram showing the pathways of the laser beam group around the optical member M ($\beta$=2).

The laser beam pattern element 11 propagates in the z direction (0,0,1), note that its pathway is I1, and it is incident on the position R1 of incidence in the opening RRI on the light incident surface IS of the optical member M (incident angle $\alpha$), and is refracted at this position (refraction angle $\theta$), and propagates inside the optical member M, and is emitted from the emission position R2 of the opening RRO of the light emitting surface OS.

Further, the laser beam pattern element 11 is refracted when the element emits from the emission position R2, and its propagates along the z direction. Note that the position of each laser beam pattern element is represented by its central axis.

The laser beam pattern element 12 propagates in z direction (0,0,1), note that its pathway is I2, and it is incident on the position K1 in the opening RRI on the light incident surface IS of the optical member M (incident angle $\alpha$), and is refracted at this position (refraction angle $\theta$), and propagates inside the optical member M and is incident on the position K2, and is reflected at this position K2 (incident angle $\theta$), and propagates back inside the optical member M, and is incident on and reflected by the position K3 on the stripe reflection film SM, and propagates inside the optical member M, and is emitted from the emitting position K4 of the opening RRO of the light emitting surface OS.

Further, the laser beam pattern element 12 is refracted when the element is emitted from the emitting position K4, and it propagating direction becomes perpendicular to the z direction.

As stated above, the laser beam pattern elements 11, 12 are aligned along the y direction, and the laser beam pattern element 12' after the alignment is positioned beneath (the –y direction) the laser beam pattern element 11'.

The pathways I3, I4 of the laser beam pattern elements 21, 22 are parallel to the pathways I1, I4 of the laser beam pattern elements I1, I2, respectively, and the laser beam pattern elements 11, 12, 21, 22 are sequentially aligned along the y direction.

Figure 15:
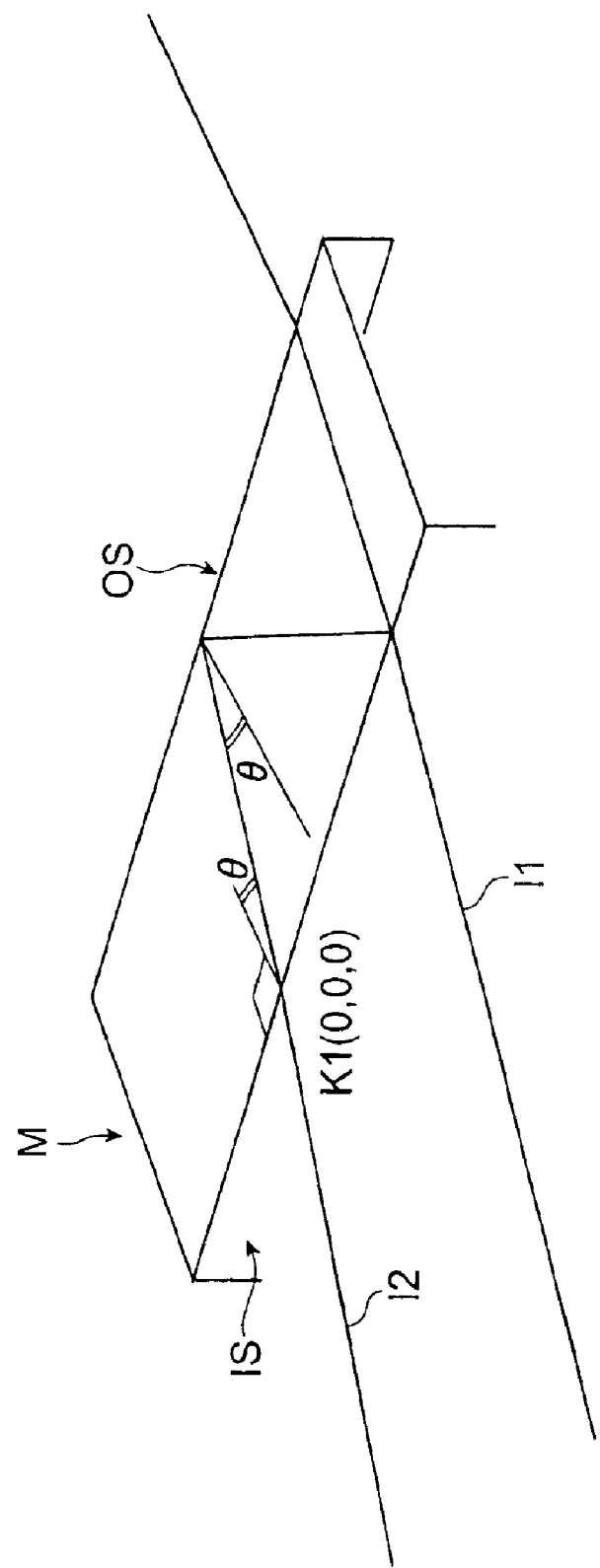
FIG. 15 is a figure showing pathways I1, I2 of the laser beam pattern elements 11, 12. The pathways I1 and I2 emitted from the light emitting surface OS overlap when viewing from direction y.

FIG. 15 is a figure showing pathways I1, I2 of the laser beam pattern elements 11, 12. The pathways I1 and I2 emitted from the light emitting surface OS overlap when viewed from the direction y.

The optical member M will be explained in more detail below.

The following parameters are defined before the explanation. Note that three dimensional coordinate system (orthogonal coordinate system)is consist of x, y and z axes.

x: alignment direction of the laser beam pattern element y: layering direction of the laser bar B z: propagating direction of the laser beam group emitted from the laser bar B Y0: laser bar stacking cycle Y1: the distance (width) perpendicular to both of the longitudinal direction and the thickness direction of one reflection film of the stripe reflection films SM Y2: the distance between the films of the stripe reflection films SM.

$\gamma$: the angle between the longitudinal direction of one reflection film SM of the stripe reflection films and the boundary line BLO between the reflection film PM in the light emitting surface OS and the remaining region RRO ($\gamma$<180° ).

D: the thickness of the parallel glass plate GS.

n*: the refractive index of the parallel glass plate GS.

$\beta$: the number of laser beam pattern elements divided, the beam pattern being emitted from one laser bar B.

(1, m, n): the normal vector of the light incident surface IS (light emitting surface) OS.

N: a unit vector of the normal of the light incident surface IS.

w: the length of the laser beam emitted from one laser bar B in the x direction.

$\alpha$: the angle of incidence the laser beam incident on the optical member M.

$\theta$: the initial refraction angle of the laser beam incident on optical member M.

O: a unit vector in a direction extending from K1 to the reflection position K2.

I: a unit vector of the propagating direction of the laser beam that is incident on the optical member M.

Figure 16:
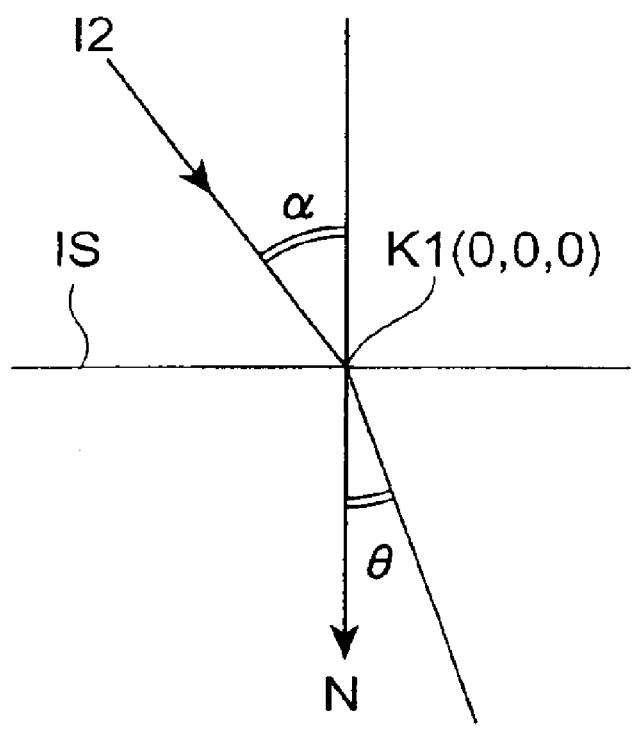
FIG. 16 is a diagram showing the relationship between the incident angle $\alpha$ and refraction angle $\theta$ when the laser beam is incident on the optical member M.

FIG. 16 is a diagram showing the relationship between the incident angle $\alpha$ and refraction angle $\theta$ when the laser beam is incident on the optical member M. All of the laser beams propagate along z axis (0, 0, 1), are incident on the optical member M with the incident angle $\alpha$, and, after that, are emitted from the member with emitting angle $\theta$ according to Snell's law (sin $\alpha$=n*sin $\theta$).

Further, the above parameters satisfy the following relationship:

$$O = \frac{I + N(\sqrt{n^{*2} - 1 + \cos^2\alpha} - \cos\alpha)}{n^*}$$

$$E = \sqrt{n^{*2} - 1 + \cos^2\alpha} - \cos\alpha$$

The equation of the light incident surface IS is:

lx+my+nz=0

The equation of the light emitting surface OS is:

lx+my+nz=D

The width of the laser beam pattern w is:

$$w = \frac{4(\beta-1)nD\sqrt{l^2+m^2}}{(E+n)}$$

The maximum relative displacement Y along the y direction of a laser beam pattern element compared to an un-reflected laser beam pattern element, when the laser beams are divided into β equal parts is:

$$Y = \frac{2nmD(\beta-1)}{E+n}$$

The general relationship $$n = \cos\alpha$$
$$l^2 + m^2 + n^2 = 1$$

Figure 17:
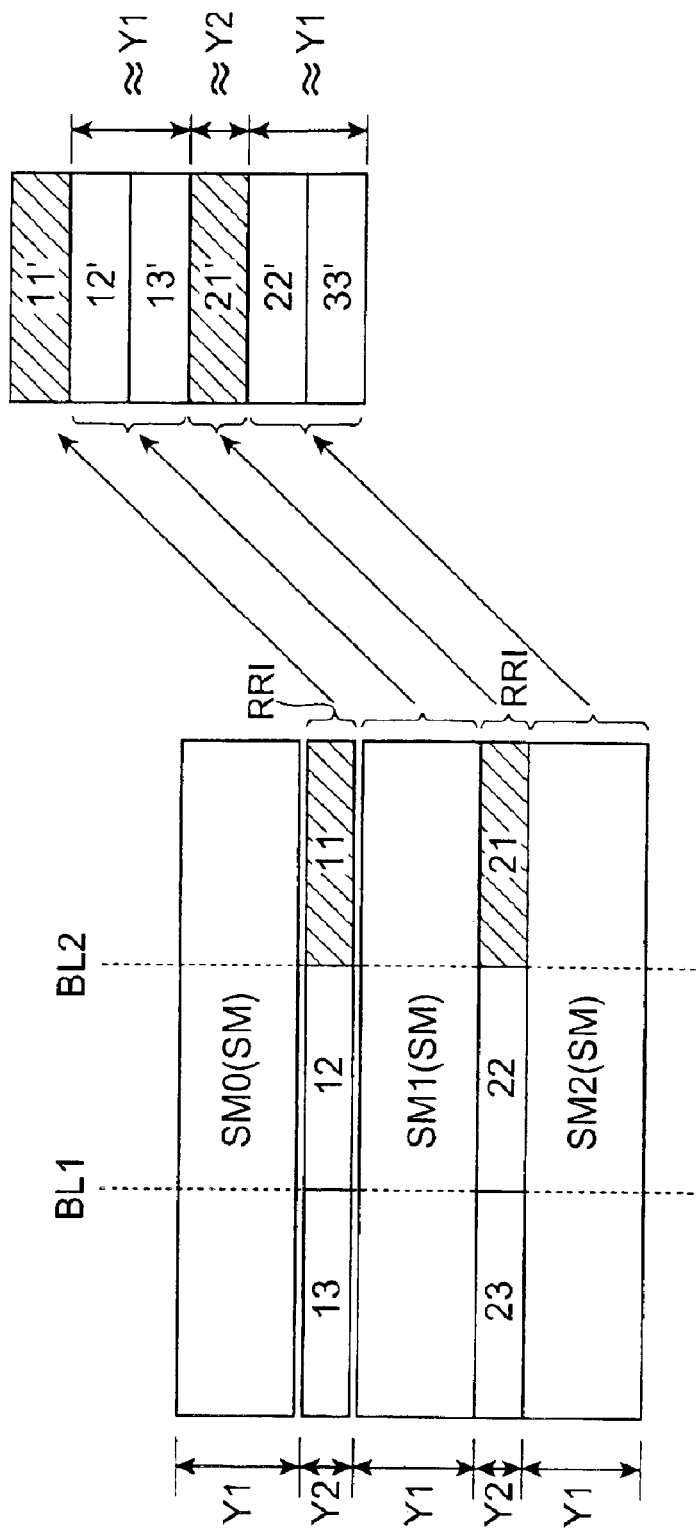
FIG. 17 is an explanation diagram showing stripe reflection films SM and their gaps RRI.

FIG. 17 is a diagram showing stripe reflection films SM and their gaps RRI.

In the optical member M as described above, when one laser beam pattern emitted from one laser bar B divided into β equal parts, (for example, β=3), (β−1) laser beam pattern elements 12, 13 are reflected by one reflection film SM, and are aligned in the gap (distance βY2) between the laser beam pattern element 21 (21') and elements 12', 13'. That is, the width Y1 of the reflection film SM is preferably set to (β−1) times of the gap Y2. In other words, they satisfy following relationship. Note that when there are 3 divisions, the number of the boundary lines BL1, BL2 is 2.

$$\beta = \frac{Y1}{Y2} + 1$$

When the above relationship is satisfied, the maximum relative displacement Y along y direction is about Y1. Since the normal of the parallel glass plate GS is at an angle to the z axis, the displacement Y1 is set to equal to or greater than the displacement Y.

$$Y1 \geq Y = \frac{2nmD(\beta-1)}{(n+E)}$$

When there conditions are satisfied, the laser beam pattern being elements 12, 13 transmitted through the gap RRI are reflected by the reflection film SM1 having distance Y1. Note that since the parallel glass plate GS is angled in order to achieve the above alignment of the laser beam pattern elements, an angle is formed between the boundary line BLO (between the partial reflection film PM and opening region RRO) and the alignment direction of the stripe reflection film SM. The boundary line BLO is aligned along the y axis when viewing from the z axis. One nodal line is defined the intersection of the light emitting surface OS and a plane parallel to yz plane, and the other nodal line is defined the intersection of the light emitting surface OS and a plane parallel to xz plane, and the angle γ (γ<180°) between these nodal lines is given as following expression:

$$\gamma = \arccos\frac{-ml}{\sqrt{m^2+n^2}\sqrt{l^2+n^2}}$$

The above parameters are, for example, set as follows: Y0=1.6, Y1=1.08, Y2=0.54, γ=95°, D=4.6 mm, n*=1.5, β=3, l=0.40, m=0.18, n=0.9, w=10 mm, α=26°.

The foregoing explains a shaping optical system for a laser bar layered product S for shaping a laser beam from laser bar layered product S. The product S is comprised of a plurality of laser bars B each having a plurality of semiconductor laser elements arrayed one-dimensionally. The laser bars B are layered along a direction (y) which is perpendicular to both the array direction of said semiconductor laser elements and the laser beam traveling direction (z).

The first laser beam group (laser beam pattern elements 11, 21, 31, 41) emitted from the laser bar layered product S is at one side of the boundary line BL along said direction of layering, and a second laser beam group (laser beam pattern elements 12, 22, 32, 42) emitted from the laser bar layered product S is on the other side of the boundary line BL.

The optical system comprises the optical member M having one surface on which the first and second laser beam groups are incident, and the other surface OS from which the first and second laser beam groups are emitted.

The optical member M comprises one glass plate GS having parallel surfaces, one surface IS has stripe reflection films SM thereon, and the other surface OS has the reflection film PM thereon so that the second laser beam group (12, 22, 32, 42) travels along the layering direction (y) relative to the first laser beam group (11, 12, 13, 14), thereby the first and second laser beam groups are emitted from the remaining region RRO of the other surface OS.

According to the shaping optical system for the laser bar layered product and the optical member M, when the stripe reflection films SM and reflection film PM satisfy the predetermined condition, the laser beams are aligned along the layering direction y, the light intensity distribution emitted from the laser bar stack is compressed, and the light density is increased, despite of its simple structure.

As stated above, although the structure of the shaping optical system for the laser bar layered product and the optical member are simple, they may shape the laser light beam to align them.

What is claimed is:

1. A shaping optical system for a laser bar layered product for shaping
   a laser beam from a laser bar layered product in which a plurality of laser bars, each of which is comprised of a plurality of semiconductor laser elements arrayed one-dimensionally, are layered along a direction which is perpendicular to both the array direction of said semiconductor laser elements and the laser beam traveling direction, comprising:
   a refracting optical system,
      a first laser beam group being at one side of a boundary line,
      a second laser beam group being at the other side of the boundary line,
      the boundary line being along said direction of layering,
      said second laser beam group being relatively shifted together with respect to said
      first laser beam group along the direction of said layering; and
   a transmission/reflecting optical system, which transmits and reflects said first and second laser beam groups so that said shifted first and second laser beam groups align along said direction of layering.

2. The shaping optical system for a laser bar layered product according to claim 1, wherein said refracting optical system is comprised of plane parallel glass elements, of which a normal line exists in a plane including a traveling direction of at least one of said first and second laser beam groups and said direction of layering, and forms a predetermined angle with said traveling direction.

3. The shaping optical system for a laser bar layered product according to claim 2, wherein said plane parallel glass element further comprises a first plane parallel glass plate which is used with a light transmission space, and is set such that one of said first and second laser beam groups which has a shorter optical path up to the emission position of said transmission/reflecting optical system transmits said first plane parallel glass plate, and the other which has a longer optical path transmits the light transmission space.

4. The shaping optical system for a laser bar layered product according to claim 2, wherein said plane parallel glass element comprises a first plane parallel glass plate and a second plane parallel glass plate which is thicker than said first plane parallel glass plate, and is set such that one of said first and second laser beam groups which has a shorter optical path up to the emission position of said transmission/ reflecting optical system transmits said second plane parallel glass plate, and the other which has a longer optical path transmits the first plane parallel glass plate.

5. The shaping optical system for a laser bar layered product according to claim 4, wherein said first and second plane parallel glass plates are integrated.

6. The shaping optical system for a laser bar layered product according to claim 1, wherein said transmission/reflecting optical system further comprises a first reflecting element which reflects one of said first and second laser beam groups in a plane including said array direction and said traveling direction, and a second reflecting element to which the laser beam group reflected by said first reflecting element enters, wherein said second reflecting element is comprised of a reflecting area for reflecting one of said first and second laser beam groups and a transmission area for transmitting the other, which are alternately formed in stripes along said direction of layering.

7. The shaping optical system for a laser bar layered product according to claim 6, wherein the length along said array direction of said transmission area is longer than the length along said array direction of the laser beam group which transmits the transmission area.

8. The shaping optical system for a laser bar layered product according to claim 1, wherein said refracting optical system is a prism which relatively shifts at least one of said first and second laser beam groups together, with respect to the other, only in said direction of layering.

9. A laser light source comprising the shaping optical system for a laser bar layered product according to claim 1, arranged on laser beam groups emitted from said laser bar layered product.

10. A shaping optical system for a laser bar layered product for shaping a laser beam from a laser bar layered product in which a plurality of laser bars, each of which is comprised of a plurality of semiconductor laser elements arrayed one-dimensionally, are layered along a direction which is perpendicular to both the array direction of said semiconductor laser elements and the laser beam traveling direction, comprising a optical member, wherein a first laser beam group emitted from the laser bar layered product is at one side of a boundary line along said direction of layering, and a second laser beam group emitted from the laser bar layered product is on the other side of the boundary line, wherein said optical member comprises a glass plate having parallel surfaces, one of said surfaces having stripe reflection films thereon, and the other of said surfaces having a partial reflection film thereon so that the second laser beam group travels along the layering direction relative to the first laser beam group, thereby first and second laser beam groups are emitted from the remaining region of the other surface.

11. A shaping optical system for a laser bar layered product for dividing and aligning laser beams from said product, said system comprising an optical member, wherein said optical member comprises a glass plate having parallel surfaces, one of said surfaces having stripe reflection films thereon, and the other of said surfaces having a partial reflection film thereon, wherein $lx+my=nz+0$ is the equation of said one of the surfaces, and $lx+my+nz=D$ is the equation of the other of said surfaces when x, y, z orthogonal coordinate system is applied, and wherein said optical member satisfies following expression:

$$Y1 \geq Y = \frac{2nmD(\beta - 1)}{(n+E)}$$
$$E = \sqrt{n^{*2} - 1 + n^2} - n$$
$$\gamma = \arccos \frac{-ml}{\sqrt{m^2+n^2}\sqrt{l^2+n^2}}$$

where,

Y1: the distance perpendicular to both of the longitudinal direction and the thickness direction of one reflection film of the stripe reflection films, γ: the angle between the longitudinal direction of one reflection film of the stripe reflection films and the boundary line between the partial reflection film and the remaining region, D: the thickness of the glass plate, n*: the refractive index of the parallel glass plate, β: the number of laser beams divided, the beam being emitted from one laser bar, x: longitudinal direction of one of said laser bars, y: layering direction of said laser bars, and z: propagating direction of laser beam emitted form one of said the laser bars.

12. An optical member comprises a glass plate having parallel surfaces, one of said surfaces having stripe reflection films thereon, and the other of said surfaces having a reflection film thereon, wherein $lx+my+nz=0$ is the equation of said one of the surfaces, and $lx+my+nz=D$ is the equation of the other of said surfaces when x, y, z orthogonal coordinate system is applied, and wherein said optical member satisfies following expression:

$$\beta = \frac{Y1}{Y2} + 1$$
$$Y1 \geq Y = \frac{2nmD(\beta - 1)}{(n+E)}$$
$$E = \sqrt{n^{*2} - 1 + n^2} - n$$
$$\gamma = \arccos \frac{-ml}{\sqrt{m^2+n^2}\sqrt{l^2+n^2}}$$

where,

Y1: the distance perpendicular to both of the longitudinal direction and the thickness direction of one reflection film of the stripe reflection films, Y2: the distance between the films of the stripe reflection films.

γ: the angle between the longitudinal direction of one reflection film of the stripe reflection films and the boundary line between the reflection film and the remaining region, D: the thickness of the glass plate, and n*: the refractive index of the parallel glass plate.

* * * * *